(12) United States Patent
Kim

(10) Patent No.: US 7,238,962 B2
(45) Date of Patent: Jul. 3, 2007

(54) SEMICONDUCTOR CHIP WITH TEST PADS AND TAPE CARRIER PACKAGE USING THE SAME

(75) Inventor: Dong-Han Kim, Kyunggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 146 days.

(21) Appl. No.: 10/801,501

(22) Filed: Mar. 12, 2004

(65) Prior Publication Data

US 2004/0238818 A1 Dec. 2, 2004

(30) Foreign Application Priority Data

Mar. 13, 2003 (KR) ............... 10-2003-0015696

(51) Int. Cl.
*H01L 23/58* (2006.01)
(52) U.S. Cl. .............. 257/48; 257/730; 257/735; 438/15
(58) Field of Classification Search ............ 257/48
See application file for complete search history.

(56) References Cited

U.S. PATENT DOCUMENTS 6,127,729 A * 10/2000 Fukuda ............ 257/736
6,861,665 B2 * 3/2005 Kim ............... 257/48

FOREIGN PATENT DOCUMENTS

| JP | 05-021514 | 1/1993 |
| JP | 06-120313 | 4/1994 |
| JP | 2001-358305 | 12/2001 |
| JP | 2002-303653 | 10/2002 |
| KR | 1020020030140 | 4/2002 |

OTHER PUBLICATIONS

English language abstract of Korean Publication No. 1020020030140.
English language abstract of Japanese Publication No. 06-120313.
English language abstract of Japanese Publication No. 05-021514.
English language abstract of Japanese Publication No. 2001-358305.
English language abstract of Korean Publication No. 2002-303653.

* cited by examiner

*Primary Examiner*—Jerome Jackson
*Assistant Examiner*—José R. Diaz
(74) *Attorney, Agent, or Firm*—Marger Johnson & McCollom, P.C.

(57) ABSTRACT

A semiconductor chip with test pads and a tape carrier package using the same are provided. The tape carrier package comprises a semiconductor chip. The semiconductor chip has an active surface and a back surface. The active surface has a main circuit area having integrated circuits and a peripheral area having chip pads connected to the integrated circuits. The semiconductor chip has test pads connected to the chip pads for testing the characteristics of the integrated circuits. The tape carrier package further comprises a tape wiring substrate having an insulating base film, wiring patterns formed on the insulating base film, leads formed integrally with the wiring patterns and dummy leads electrically isolated from the wiring patterns, and bumps connecting the chip pads to the corresponding leads and the test pads to the dummy leads.

15 Claims, 6 Drawing Sheets

SEMICONDUCTOR CHIP WITH TEST PADS AND TAPE CARRIER PACKAGE USING THE SAME

CROSS REFERENCE TO RELATED APPLICATIONS

This U.S. non-provisional application claims priority under 35 U.S.C. §119 to Korean Patent Application No. 2003-15696 filed Mar. 13, 2003, the contents of which are incorporated by reference.

BACKGROUND OF THE INVENTION

1. Field of the Invention

The present invention relates to a semiconductor chip with test pads and a tape carrier package using the same.

2. Description of the Related Art

A process for manufacturing a semiconductor device is generally divided into two processes, i.e., a wafer fabrication and a package assembly. Devices such as transistors, resistors or capacitors are integrated in a semiconductor wafer by the wafer fabrication process to form circuits having a particular predetermined function. The semiconductor wafer is divided into a plurality of individual semiconductor chips by the package assembly process. Each semiconductor chip can be provided as a chip per se, or as a final product in which it is packaged in a suitable form. A test process is performed on the semiconductor device during or after its manufacture. The test process monitors the performance of the semiconductor devices manufacturing method, and tests the quality of these devices. The testing process improves the operational reliability of the devices.

Each chip of the semiconductor wafer includes test pads for use in the test process on the wafer. The test pads may provide an electrical path to a selected circuit and allow an electrical parameter of the semiconductor device to be measured through a test probe of an external test apparatus. Tests which use the test pads may allow verification of the reliability of the integrated circuits and test the performance of the semiconductor device manufacturing method by comparing measured parameters with designed parameters.

The test pads should be of a size which is large enough to accommodate a test probe. The test pads may be formed in a main circuit area, or an area between the chips, in order to promote maximum usage of an available wafer area. In case a semiconductor chip is to be used for operating a display, the test pads may not be provided in the area between the chips, but are instead located in the semiconductor chip itself.

Referring to FIG. 1 through FIG. 2c, the conventional semiconductor chip 210 has an active surface and a back surface. The active surface has a main circuit area 211 and a peripheral area 212. Integrated circuits (not shown) are formed in the main circuit area 211. The semiconductor chip 210 is an edge-pad-type chip, in which chip pads 213 are disposed along the edges of its active surface. The chip pads 213 are connected to the integrated circuits for external input and output. The chip pads 213 are arranged in the peripheral area 212 in rows parallel to the adjacent edges of the semiconductor chip 210. Dummy pads 215 are formed in the rows of the chip pads 213 for improved connection strength during chip mounting. The dummy pads 215 assume the configuration of a chip pad, but are not connected to the integrated circuits or the chip pads 213.

A plurality of test pads 217 are connected to the integrated circuits by wirings 218 in the main circuit area 211. They are grouped together. Each test pad 217 has a size large enough to be contacted with a test probe of an external test apparatus. Although FIG. 2a and FIG. 2b show ten test pads 217 which are illustratively grouped together, the number of test pads 217 are not limited to the exemplary number depicted.

Conventionally, the test pads are connected to the integrated circuits and formed inside the chip. Thus, the circuit characteristics of the chip can be tested by making contact with the test probe of the external test apparatus on the wafer during or after the wafer fabrication process. For example, after the wafer fabrication process, an electric die sorting test may be performed to determine the electrical characteristics of the chip, i.e., whether the chip is acceptable or faulty.

The conventional semiconductor chip has some disadvantages. For example, because the test pads are formed for testing the wafer, they are not useful after the testing process has been completed. The test pads in a final product unnecessarily occupy the space on the semiconductor chip. This may be an obstacle to reduction of the chip size. Further, the test pads are located in the main circuit area. The test pads may make contact with the test probe causing damage to the integrated circuits. In order to overcome this disadvantage, a membrane should be added.

In another case, even though the test pads are formed in the area between the chips, it is difficult to significantly reduce the overall chip size.

SUMMARY OF THE INVENTION

One exemplary embodiment of the present invention is directed to a semiconductor chip with test pads. The semiconductor chip has an active surface and a back surface. The active surface has a main circuit area having integrated circuits and a peripheral area having chip pads connected to the integrated circuits. The semiconductor chip has a plurality of test pads for testing the characteristics of the integrated circuits. The test pads are connected to the integrated circuits by wirings. The test pads are formed in the peripheral area. Therefore, the size of the main circuit area can be reduced, in which in turn reduces the overall chip size.

The chip pads may be arranged in rows parallel to the edges of the active surface of the semiconductor chip. The test pads may be formed in the rows of chip pads.

Another exemplary embodiment of the present invention is directed to a tape carrier package. The tape carrier package comprises a semiconductor chip. The semiconductor chip has an active surface and a back surface. The active surface has a main circuit area having integrated circuits and a peripheral area having chip pads connected to the integrated circuits for external input and output. The chip pads are arranged in rows parallel to the edges of the active surface of the semiconductor chip. Test pads are arranged in the rows of chip pads and connected to the integrated circuits. The test pads test the characteristics of the integrated circuits. A tape wiring substrate includes an insulating base film, wiring patterns formed on the base film, leads formed integrally with the wiring patterns and dummy leads electrically isolated from the leads. Bumps connect the chip pads to the corresponding leads and the test pads to the dummy leads.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and in which.

DETAILED DESCRIPTION OF THE INVENTION

Exemplary embodiments of the present invention will be described below with reference to the accompanying drawings.

Figure 1:
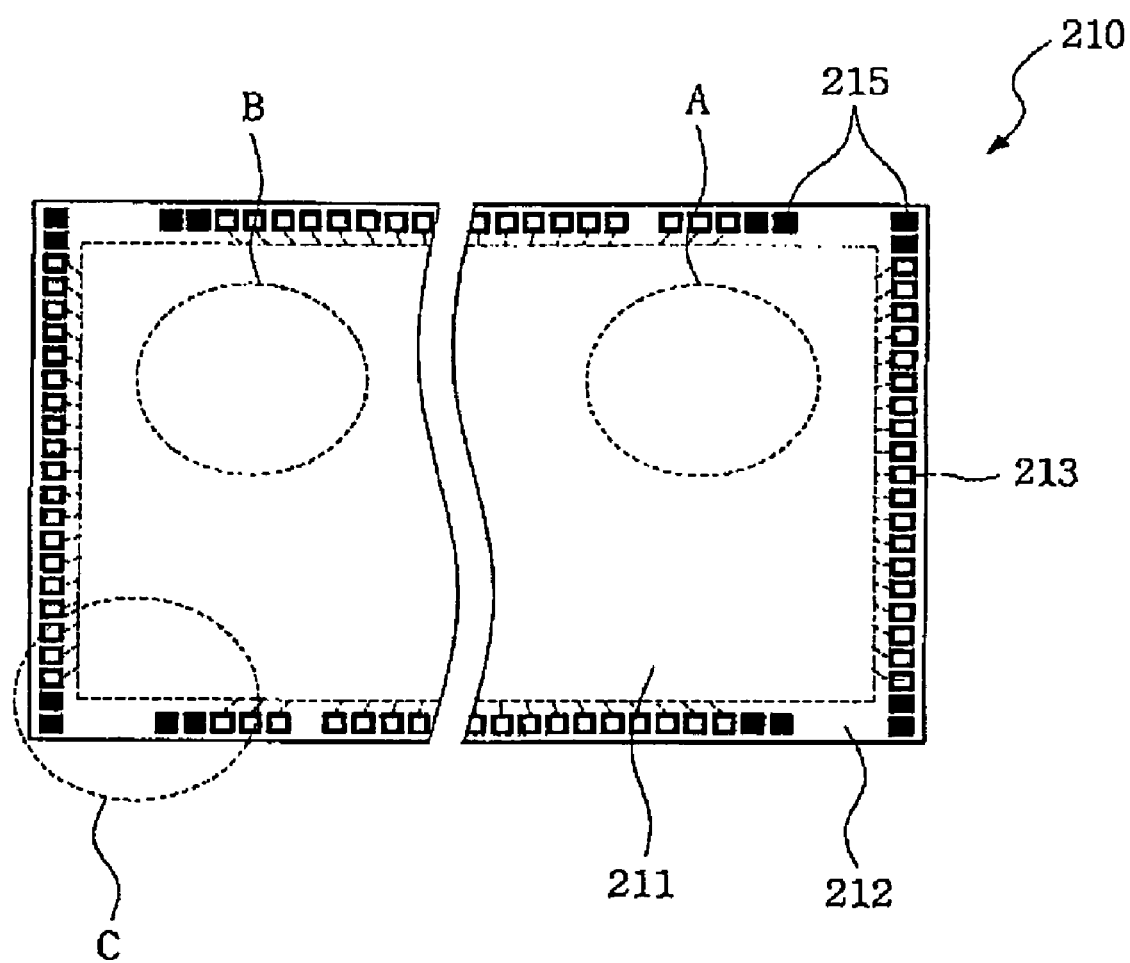
FIG. 1 is a plan view of a conventional semiconductor chip.
Figure 2A:
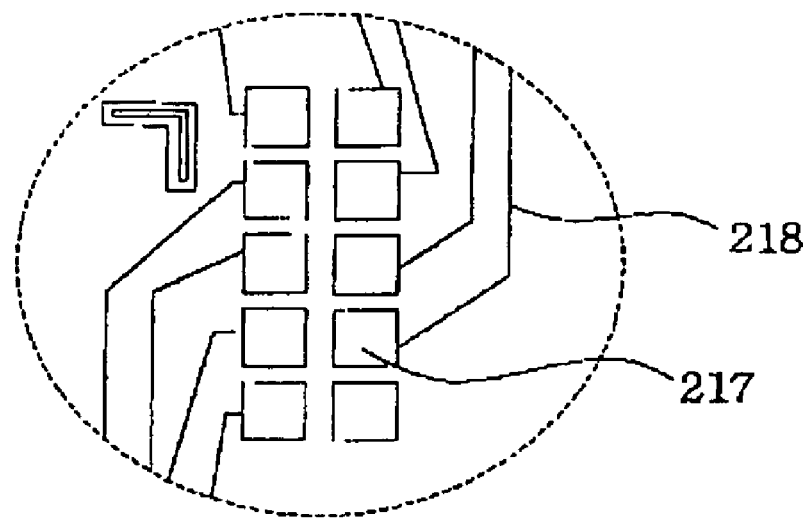
FIG. 2a is an enlarged view of section A shown in FIG. 1.
Figure 2B:
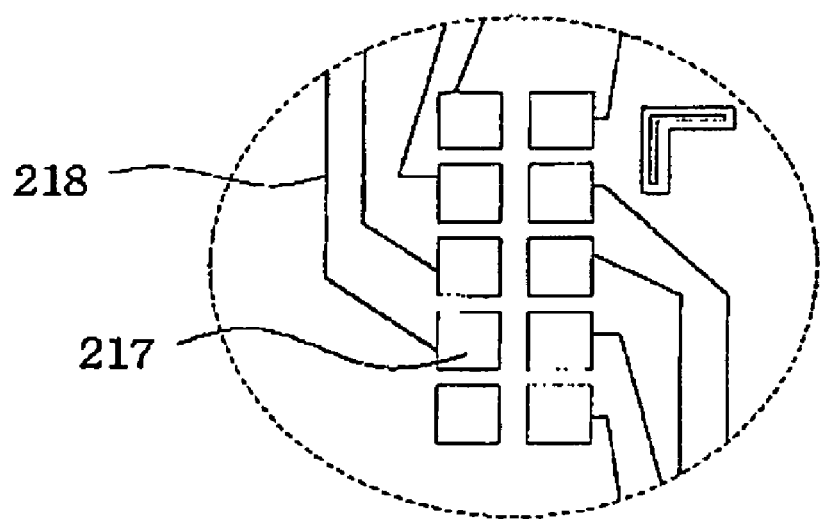
FIG. 2b is an enlarged view of section B shown in FIG. 1.
Figure 2C:
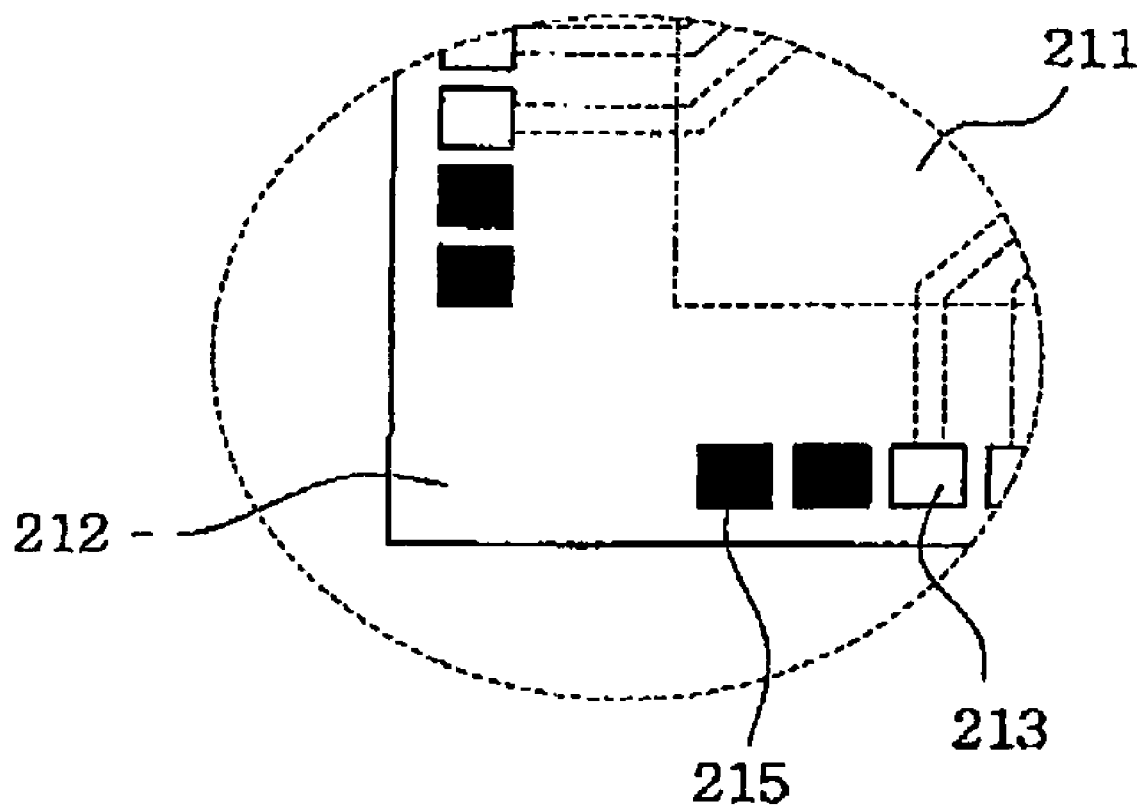
FIG. 2c is an enlarged view of section C shown in FIG. 1.
Figure 3:
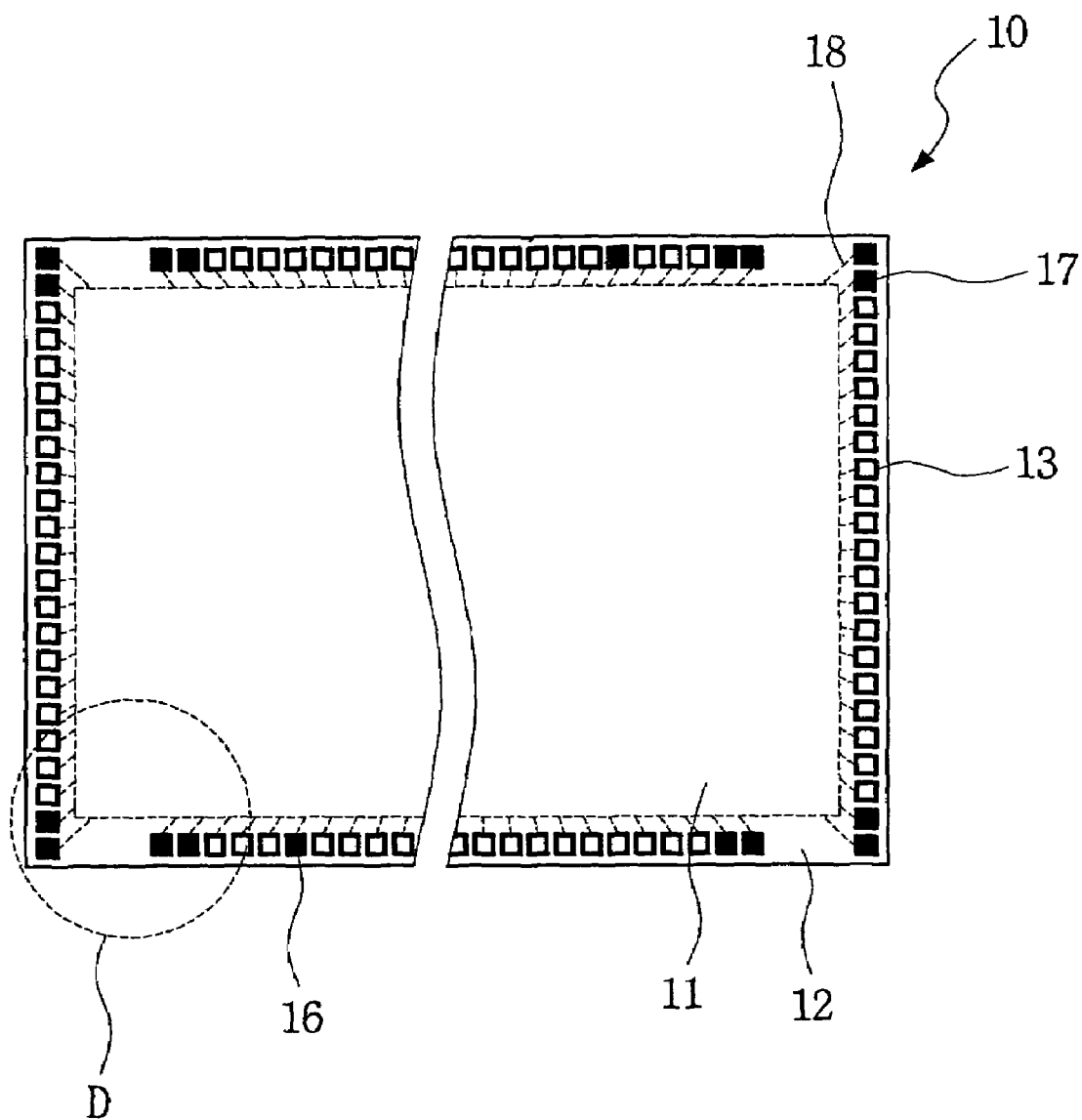
FIG. 3 is a plan view of a semiconductor chip in accordance with an exemplary embodiment of the present invention.
Figure 4:
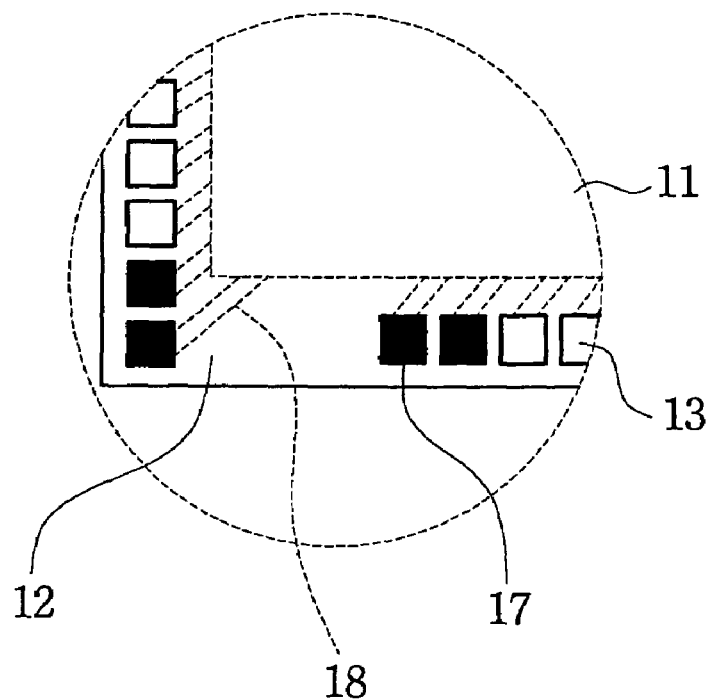
FIG. 4 is an enlarged view of section D shown in FIG. 3.

Referring to FIGS. 3 and 4, a semiconductor chip 10 is designed for operating, for example, a display. The semiconductor chip 10 has an active surface and a back surface. The active surface has a main circuit area 11 and a peripheral area 12. The main circuit area 11 has integrated circuits (not shown), in which devices such as transistors, resistors or capacitors are integrated to have a particular function. The peripheral area 12 has chip pads 13 connected to the integrated circuits for external input and output. The chip pads 13 are arranged in rows parallel to the adjacent edges of the active surface of the semiconductor chip 10.

Test pads 16 and 17 are formed in the rows of the chip pads 13. The test pads 16 and 17 are connected to the integrated circuits by wirings 18 for testing the properties of the integrated circuits. The test pads 16 and 17 have a size large enough to be contacted with a test probe of an external test apparatus. In this embodiment, the test pads 16 and 17 are the same size as the chip pads 13.

The chip 10 includes additional test pads 17 formed at the opposing ends of the rows of the chip pads 13 near the corners of the main circuit area or the active surface. The chip 10 further includes additional test pads 16 formed in empty areas in the rows of chip pads 13. The test pads 16 and 17 and the chip pads 13 may be all arranged at substantially uniform intervals in each row. This can provide overall balance and improved connection strength to the physical connection structure of the chip 10.

A feature of the present invention is that the test pads are not formed in the main circuit area but in the peripheral area, preferably in empty areas where chip pads are not formed. The test pads are arranged within the rows of chip pads. Therefore, the present invention does not require a separate area for the test pads. The chip size may be reduced and thus the quantity of semiconductor chips obtainable in one wafer may be increased. If the chip size is the same as that of the conventional semiconductor chip, the space available for forming patterns can be greater.

When the chip is mounted by bump bonding, the bump bonding may be also performed on the test pads. In this way, the connection strength between the chip and a substrate can be improved. The test pads may be introduced near the corners of the main circuit area or the active surface of the semiconductor chip where chip pads are not typically provided. This may lead to further improved connection strength. Moreover, the chip pads and the test pads may be arranged at substantially uniform intervals in each row to facilitate a more balanced mounting effect.

Although this embodiment shows an edge-pad-type chip, of which the chip pads are arranged along the edges of the active surface, many variations and/or modifications may be employed. For example, a center-pad-type chip may be provided in which the chip pads are arranged at the center of the active surface. Alternatively, a chip may be fabricated in which the chip pads are arranged along two opposing edges.

Figure 6:
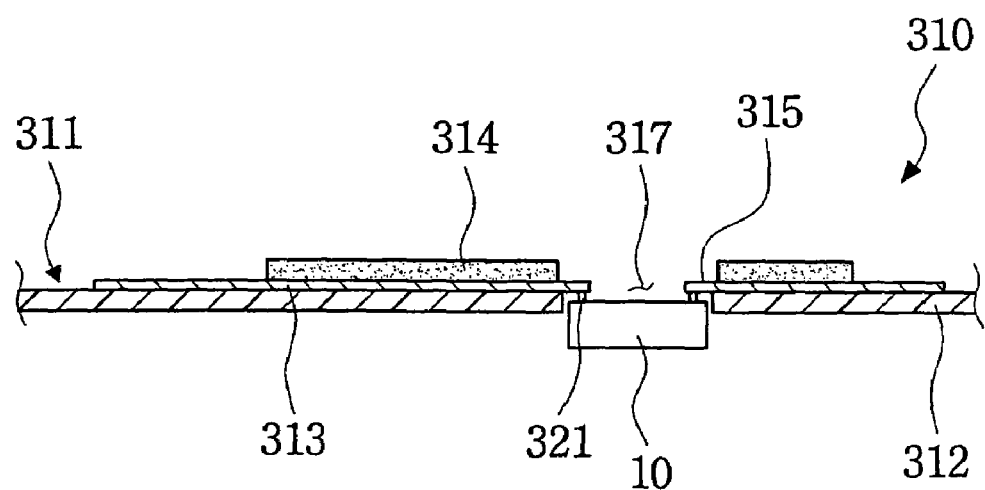
FIG. 6 is a cross-sectional view of a tape carrier package in accordance with an exemplary embodiment of the present invention.
Figure 5:
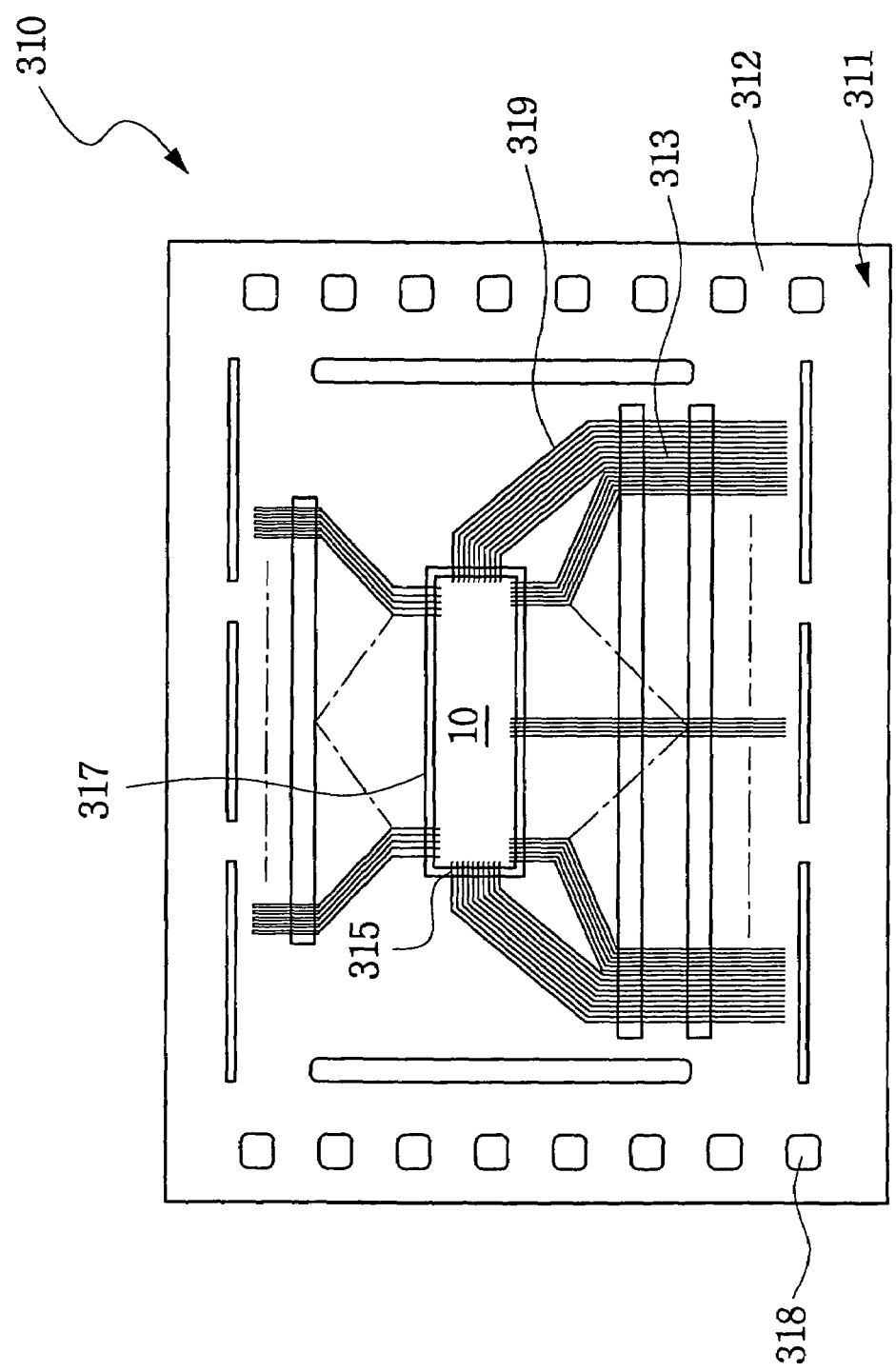
FIG. 5 is a plan view of a tape carrier package in accordance with an exemplary embodiment of the present invention.

Referring to FIGS. 3, 5 and 6, a tape carrier package 310 can be provided. A semiconductor chip 10 may be attached to a tape wiring substrate 311 by bump bonding. The semiconductor chip 10 has a plurality of chip pads 13 and test pads 17 formed in the peripheral area 12. The chip pads 13 and test pads 17 are arranged in rows parallel to the outer edges of the active surface of the semiconductor chip 10. The test pads 17 are located at the ends of the rows of the chip pads 13 and/or between the chip pads 13. The chip pads 13 and the test pads 17 are preferably arranged at substantially uniform intervals in each row. One skilled in the art will appreciate that other suitable arrangements can also be used in the present invention.

The tape wiring substrate 311 has wiring patterns 313 formed on an insulating base film 312. The substrate 311 can comprise, for example, a polyimide resin employed in conjunction with laminating and photo etching a Cu thin film. The wiring patterns 313 are covered with a protection layer 314 of solder resist. Leads 315 are connected to the wiring patterns 313. The leads 315 (FIG. 6) extend from the protection layer 314 to a window 317 (FIG. 6) which can be used for electrical connection to the semiconductor chip 10. Sprocket holes 318 (FIG. 5) are formed at the opposing sides of the base film 312 at predetermined intervals. Dummy leads 319 are formed at the edge of the leads 315.

The chip pads 13 and the test pads 17 are bonded to the leads 315 and the dummy leads 319 by bumps 321, respectively. The semiconductor chip 10 is attached and electrically connected to the tape wiring substrate 311. The dummy leads 319 are not electrically connected to the outside.

In accordance with the tape carrier package of the present invention, the chip size may be reduced compared with the conventional semiconductor chip, consequently reducing the package size. Although the test pads consume their functional durability after a test on wafer or chip, because the test pads are bump-bonded to the dummy leads of the tape wiring substrate, the connection strength between the semiconductor chip and the tape wiring substrate is also improved. Moreover, the chip pads and the test pads are arranged evenly over one surface of the semiconductor chip, further improving the connection strength.

Although the exemplary embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A semiconductor chip comprising:
a plurality of outer edges;
a peripheral area located adjacent to the outer edges; and a main circuit area located within the confines of the peripheral area, the main circuit area including integrated circuits, wherein the peripheral area includes chip pads connected to the integrated circuits, a plurality of test pads electrically connected to the integrated circuits for testing electrical properties of the integrated circuits, the respective chip pads and test pads being arranged in first and second pairs of rows at substantially uniform intervals, the first pair of rows being arranged substantially parallel to each other and the second pair of rows being arranged substantially parallel to each other, the first pair of rows being arranged substantially perpendicular to the second pair of rows, the chip pads being arranged in each of the rows adjacent the main circuit area of the semiconductor chip, and the test pads being located within each of the rows of chip pads, and the test pads being substantially the same dimensional size as the chip pads.

2. The semiconductor chip of claim 1, wherein the test pads are located at the ends of each of the first and second pairs of rows of chip pads.

3. The semiconductor chip of claim 1, wherein the configuration of the main circuit area is arranged to form corners, and the test pads in each of the first and second pairs of rows are located near the corners of the main circuit area.

4. The semiconductor chip of claim 1, wherein the chip pads are arranged in rows parallel to at least one set of opposed outer edges of the semiconductor chip, and the test pads are arranged within each of the first and second pairs rows of chip pads.

5. The semiconductor chip of claim 1, wherein the test pads are arranged between chip pads within each of the first and second pairs rows of chip pads.

6. The semiconductor chip of claim 1, which comprises one of an edge-pad-type chip and a center-pad-type chip.

7. A tape carrier package comprising:

a semiconductor chip comprising a plurality of outer edges, a peripheral area located adjacent to the outer edges, and an main circuit area located within the confines of the peripheral area, the main circuit area including integrated circuits, the peripheral area including chip pads connected to the integrated circuits, and a plurality of test pads electrically connected to the integrated circuits for testing the electrical properties of the integrated circuits, the respective chip pads, the respective test pads, and the respective chip pads and test pads being arranged in first and second pairs of rows at substantially uniform intervals, the first pair of rows being arranged substantially parallel to each other and the second pair of rows being arranged substantially parallel to each other, the first pair of rows being arranged substantially perpendicular to the second pair of rows, the chip pads being arranged in each of the rows adjacent the main circuit area of the semiconductor chip, and the test pads being located within each of the rows of chip pads, and the test pads being substantially the same dimensional size as the chip pads; and a tape wiring substrate.

8. The tape carrier package of claim 7, wherein the test pads are located at the ends of each of the first and second pairs rows of chip pads.

9. The tape carrier package of claim 7, wherein the configuration of the main circuit area is arranged to form corners, and the test pads in each of the first and second pairs of rows are located near the corners of the main circuit area.

10. The tape carrier package of claim 7, wherein the chip pads are arranged in rows parallel to at least one set of opposed outer edges of the semiconductor chip, and the test pads are arranged within each of the first and second pairs rows of chip pads.

11. The tape carrier package of claim 7, wherein the test pads are arranged between chip pads within each of the first and second pairs rows of chip pads.

12. The tape carrier package of claim 7, wherein the tape wiring substrate comprises an insulating base film, wiring patterns formed on the insulating base film, leads formed integrally with the wiring patterns, and dummy leads electrically isolated from the wiring patterns.

13. The tape carrier package of claim 12, which further comprises bumps connecting the chip pads to the corresponding leads and the test pads to the dummy leads.

14. The semiconductor chip of claim 1, wherein the first pair of rows and the second pair of rows together form a rectangular configuration.

15. The semiconductor chip of claim 7, wherein the first pair of rows and the second pair of rows together form a rectangular configuration.

* * * * *

UNITED STATES PATENT AND TRADEMARK OFFICE
CERTIFICATE OF CORRECTION

| | |
|---|---|
| PATENT NO. | : 7,238,962 B2 |
| APPLICATION NO. | : 10/801501 |
| DATED | : July 3, 2007 |
| INVENTOR(S) | : Dong-Han Kim |

It is certified that error appears in the above-identified patent and that said Letters Patent is hereby corrected as shown below:

Title page, under Other Publications, English language abstract of Korean Publication No. 2002-303653, the word "Korean" should read -- Japanese --.

Signed and Sealed this

Thirtieth Day of September, 2008

JON W. DUDAS
*Director of the United States Patent and Trademark Office*